United States Patent
Snowdon et al.

(10) Patent No.: US 8,692,621 B2
(45) Date of Patent: Apr. 8, 2014

(54) METHODS AND APPARATUS FOR OSCILLATOR FREQUENCY CALIBRATION

(75) Inventors: Kenneth P. Snowdon, Cumberland, ME (US); Jeffrey S. Martin, Cumberland, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 109 days.

(21) Appl. No.: 13/333,186

(22) Filed: Dec. 21, 2011

(65) Prior Publication Data

US 2013/0162356 A1    Jun. 27, 2013

(51) Int. Cl.
*H03L 7/00* (2006.01)

(52) U.S. Cl.
USPC .......... 331/25; 331/1 A; 327/40; 327/42; 327/156; 327/157; 327/159

(58) Field of Classification Search
USPC .......... 331/1 A, 25, DIG. 2; 327/40, 42, 43, 327/156, 157, 159
See application file for complete search history.

(56) References Cited

U.S. PATENT DOCUMENTS

| | | | |
|---|---|---|---|
| 4,902,920 A * | 2/1990 | Wolaver | 327/12 |
| 5,635,875 A * | 6/1997 | Kusakabe | 331/1 A |
| 6,256,362 B1 * | 7/2001 | Goldman | 375/373 |
| 6,404,246 B1 | 6/2002 | Estakhri et al. | |
| 6,407,642 B2 * | 6/2002 | Dosho et al. | 331/11 |
| 2006/0057996 A1 * | 3/2006 | Petrovic et al. | 455/260 |

OTHER PUBLICATIONS

"A 0.24-nJ/bit Super-Regenerative Pulsed UWB Receiver . . . ", P. Thoppay, C. Dehollain, M. Green and M. Declercq; IEEE Journal of Solid-State Circuites, vol. 46, No. 11, Nov. 2011, 12 pages.

* cited by examiner

*Primary Examiner* — Joseph Chang
*Assistant Examiner* — Jeffrey Shin
(74) *Attorney, Agent, or Firm* — Brake Hughes Bellermann LLP

(57) ABSTRACT

In one general aspect, an apparatus can include a phase frequency detector configured to produce a plurality of indicators of relative differences between a frequency of a target oscillator signal and a frequency of a reference oscillator signal. The apparatus can also include a pulse generator configured to produce a plurality of pulses based on the plurality of indicators. The plurality of pulses can include a first portion configured to trigger an increase in the frequency of the target oscillator signal and the plurality of pulses including a second portion configured to trigger a decrease in the frequency of the target oscillator signal.

20 Claims, 14 Drawing Sheets

| Frequency Bit Values 700 | | | Frequency 710 (% kHz) | Period 720 (µs) |
|---|---|---|---|---|
| B2 | B1 | B0 | | |
| 1 | 0 | 0 | -27.4% | 37.7% |
| 1 | 0 | 1 | -22.1% | 28.3% |
| 1 | 1 | 0 | -15.9% | 18.9% |
| 1 | 1 | 1 | -8.6% | 9.4% |
| 0 | 0 | 0 | 0.0% | 0.0% |
| 0 | 0 | 1 | 8.1% | -7.5% |
| 0 | 1 | 0 | 17.7% | -15.0% |
| 0 | 1 | 1 | 39.1% | -22.6% |

FIG. 7

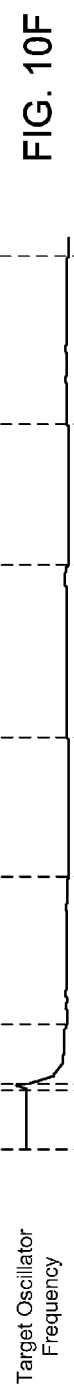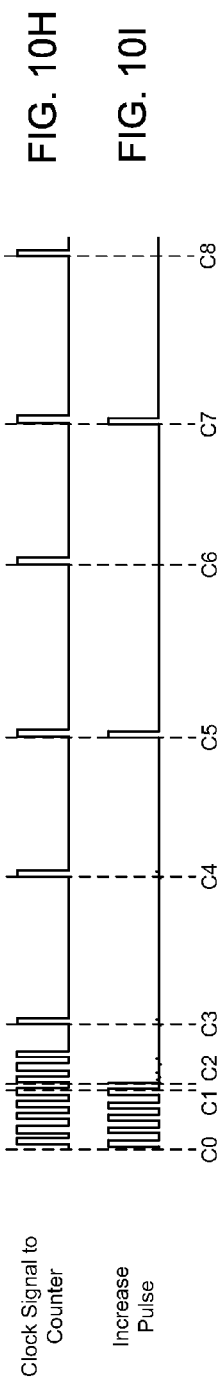

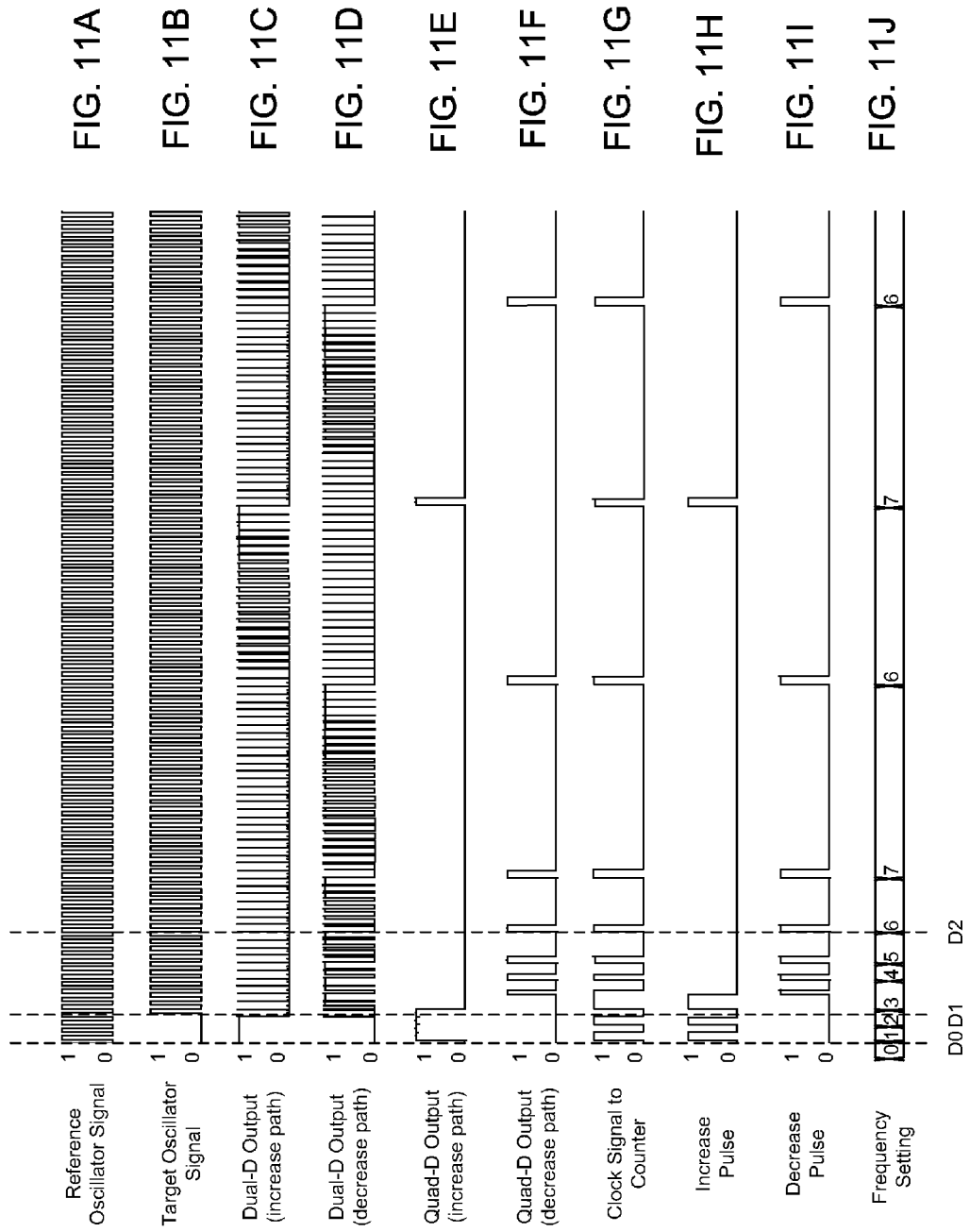

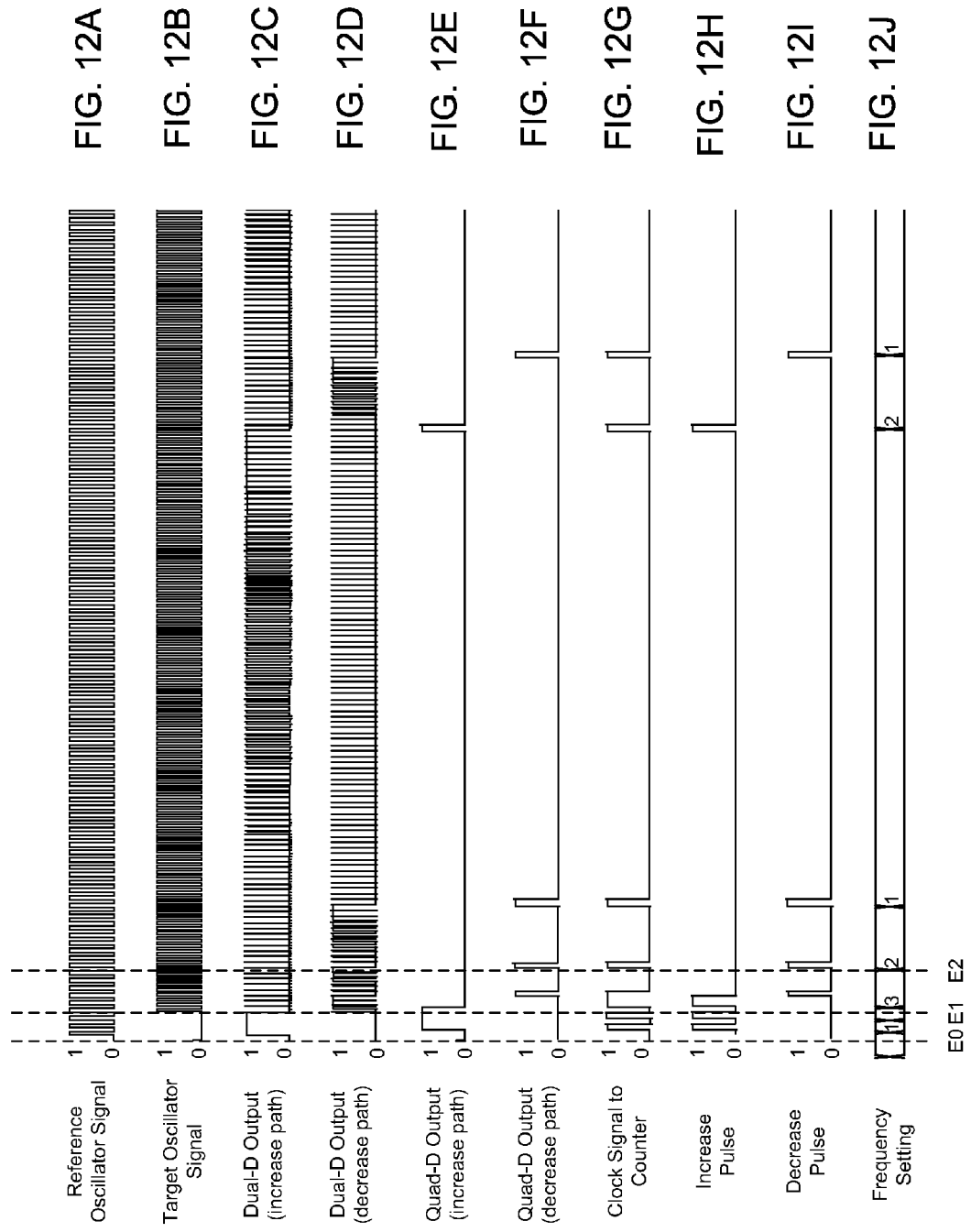

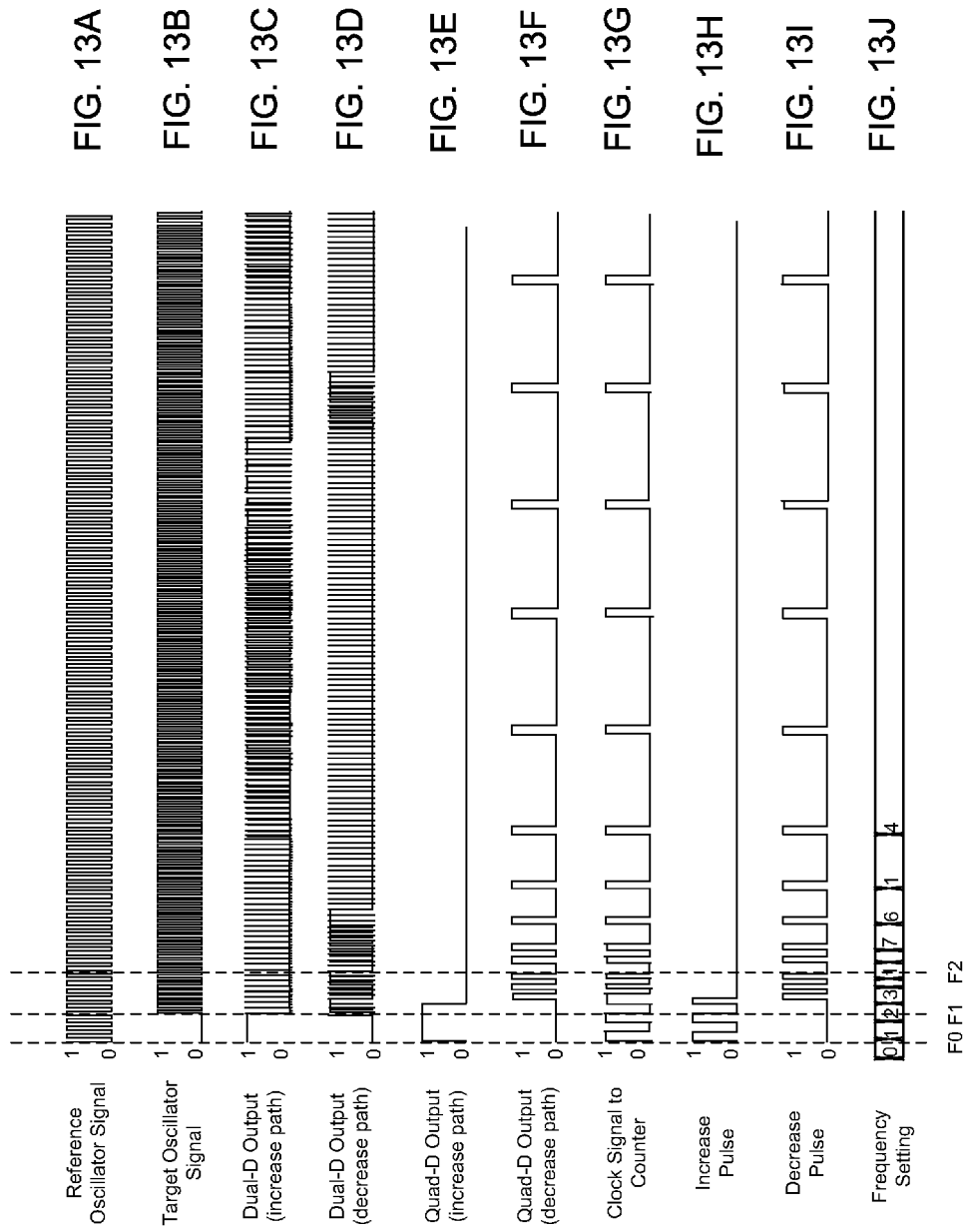

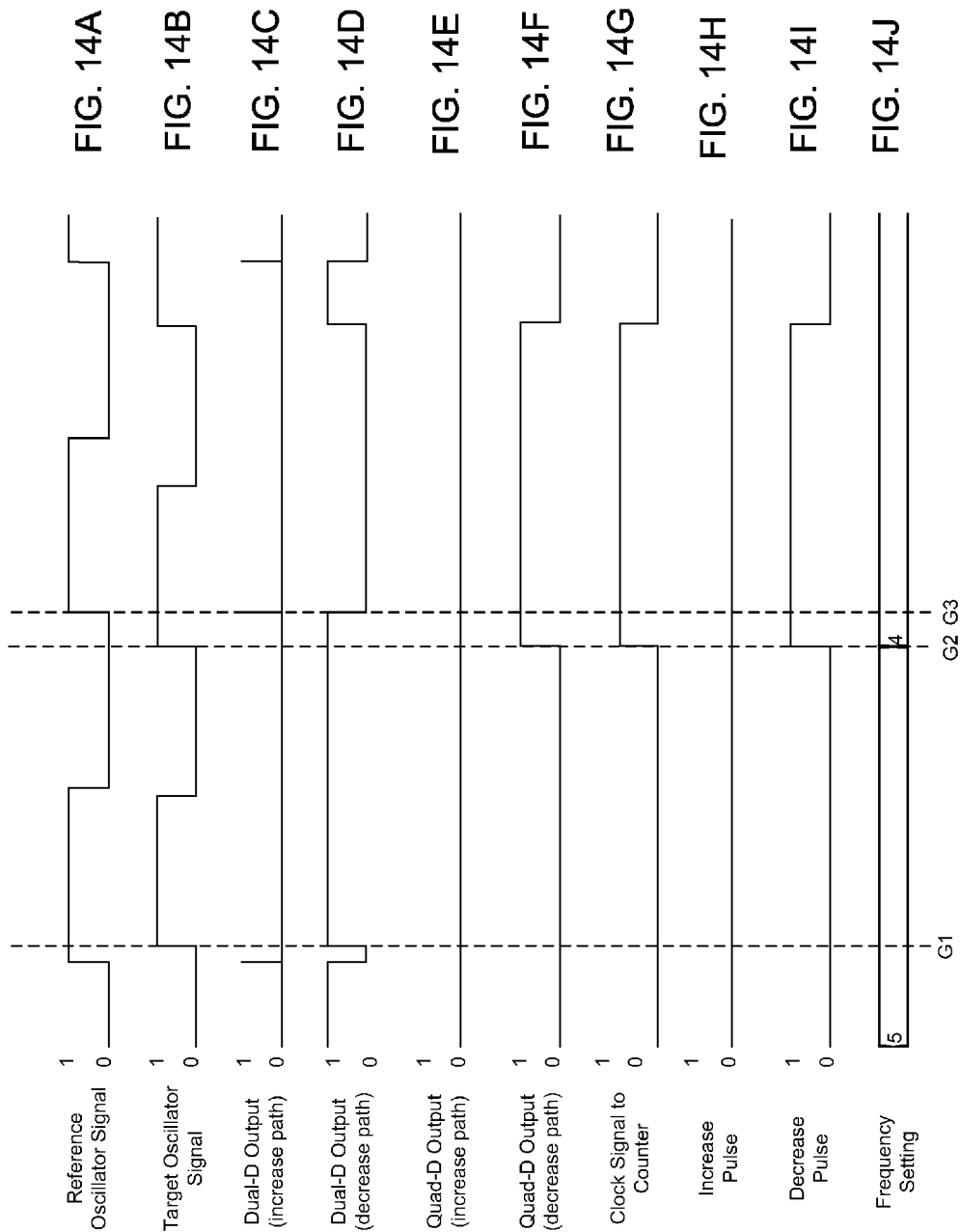

METHODS AND APPARATUS FOR OSCILLATOR FREQUENCY CALIBRATION

TECHNICAL FIELD

This description relates to methods and apparatus for oscillator calibration.

BACKGROUND

Known oscillators manufactured using semiconductor processing techniques can have a frequency output that is a function of resistors and capacitors in a resistor-capacitor (RC) network. Semiconductor processing variations can cause relatively wide variations in frequency output of the oscillators. Because the frequencies of oscillators can vary, the oscillators can include circuitry that can be used to calibrate the frequencies of the oscillators to a reference frequency. This process can be referred to as trimming the oscillator. In some instances, trimming of an oscillator can be implemented through digital bits used to couple different resistor and/or capacitor networks to change the frequency of the oscillator.

Calibration or trimming of a frequency of an oscillator can be performed using various known methods including iteratively measuring the frequency of the target oscillator output directly and converting the measurement into a correction factor, comparing counter values related, respectively, to the frequency of the target oscillator and a frequency of a reference oscillator, and so forth. Using known oscillator calibration techniques can be relatively inefficient, can consume relatively significant test time, for example, at wafer sort or final test, can occupy significant portions of device die area when implemented in hardware, and/or so forth. Thus, a need exists for systems, methods, and apparatus to address the shortfalls of present technology and to provide other new and innovative features.

SUMMARY

In one general aspect, an apparatus can include a phase frequency detector configured to produce a plurality of indicators of relative differences between a frequency of a target oscillator signal and a frequency of a reference oscillator signal. The apparatus can also include a pulse generator configured to produce a plurality of pulses based on the plurality of indicators. The plurality of pulses can include a first portion configured to trigger an increase in the frequency of the target oscillator signal and the plurality of pulses including a second portion configured to trigger a decrease in the frequency of the target oscillator signal.

The details of one or more implementations are set forth in the accompanying drawings and the description below. Other features will be apparent from the description and drawings, and from the claims.

BRIEF DESCRIPTION OF THE DRAWINGS

FIG. 7 illustrates frequency bit values associated with a target oscillator signal, according to an embodiment.

FIGS. 10A through 10I are graphs that illustrate operation of a frequency calibration device.

FIGS. 11A through 11J are graphs that illustrate operation of a frequency calibration device based on a frequency of a target oscillator signal.

FIGS. 12A through 12J are graphs that illustrate operation of a frequency calibration device based on another frequency of a target oscillator signal.

FIGS. 13A through 13J are graphs that illustrate operation of a frequency calibration device based on yet another frequency of a target oscillator signal.

FIGS. 14A through 14J are graphs that illustrate a close-up view of a downward transition of a frequency of a target oscillator signal triggered by a frequency calibration device.

DETAILED DESCRIPTION

Figure 1:
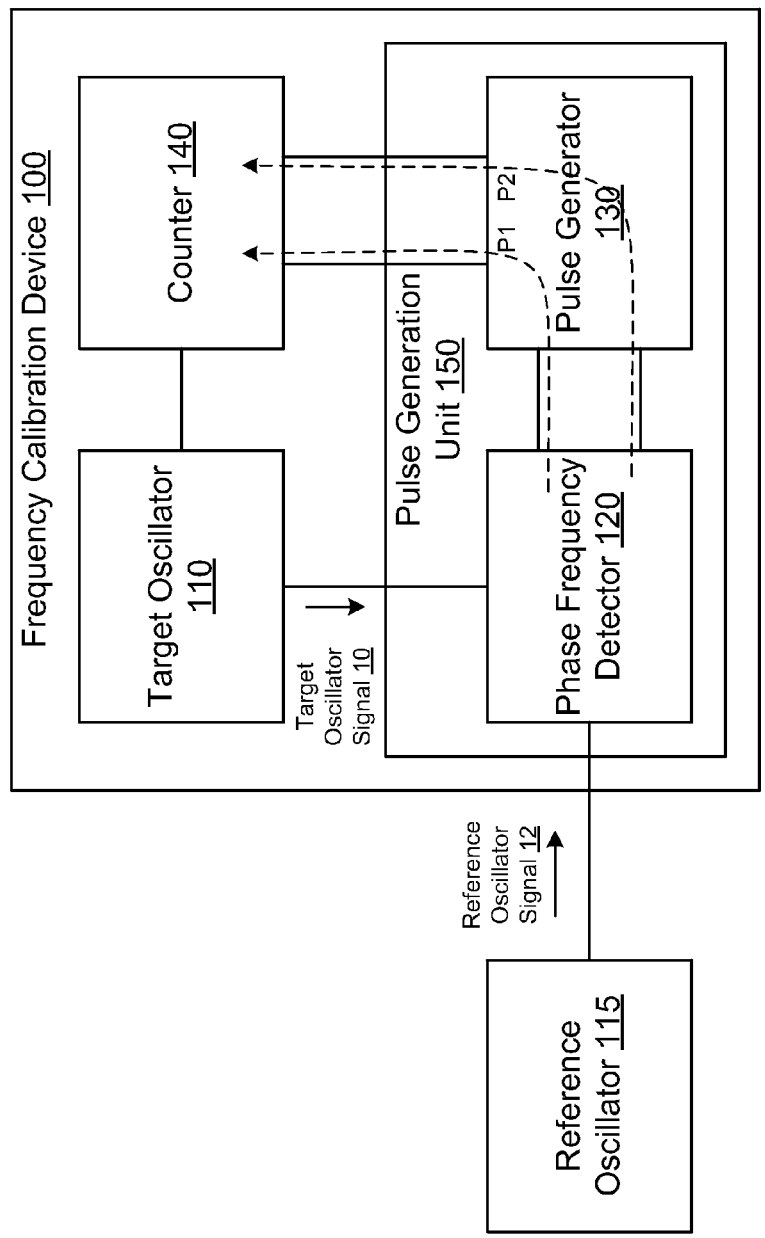
FIG. 1 is a block diagram that illustrates a frequency calibration device, according to an embodiment.

FIG. 1 is a block diagram that illustrates a frequency calibration device 100, according to an embodiment. As shown in FIG. 1, the frequency calibration device 100 includes a target oscillator 110 configured to be calibrated against a reference oscillator 115. Specifically, a frequency of a target oscillator signal 10 produced by the target oscillator 110 is configured to be calibrated against a frequency of a reference oscillator signal 12 produced by the reference oscillator 115. The target oscillator 110 can be referred to as a target oscillator because the oscillator is targeted for calibration. In some embodiments, the target oscillator signal 10 can be referred to as a target clock signal, and the reference oscillator signal 12 can be referred to as a reference clock signal. In some embodiments, an amplitude of the target oscillator signal 10 and an amplitude of the reference oscillator signal 12 can be the same or different.

The components of the frequency calibration device 100 (e.g., phase frequency detector 120, pulse generator 130, counter 140) can be configured to define a calibration loop configured to calibrate the frequency of the target oscillator signal 10 produced by the target oscillator 110 to the frequency of the reference oscillator signal 12 produced by the reference oscillator 115. In other words, the components of the frequency calibration device 100 can define a feedback loop that can be used to calibrate the frequency of the target oscillator signal 10 to the frequency of the reference oscillator signal 12.

In some embodiments, calibration of the frequency of the target oscillator signal 10 can be referred to as being performed based on a calibration procedure (e.g., a calibration algorithm). In some embodiments, the target oscillator 110 (and frequency calibration device 100) can be associated with (e.g., included in) a device such as a microprocessor (e.g., a central processing unit), a set of transistors (e.g., flip-flops), an application-specific integrated circuit (ASIC), a digital signal processing (DSP) unit, a discrete component, a computing device (e.g., a portable computing device), telecom equipment, a circuit board, and/or so forth. In some embodiments, the calibration procedure can be performed during, for example, testing (e.g., wafer sort or final test, module test, and/or so forth) and/or operation of a device including the frequency calibration device 100. In some embodiments, the reference oscillator 115, which can be included in test equipment (not shown) can be coupled to the frequency calibration device 100 during calibration of the target oscillator 110 during a test sequence. In some embodiments, the frequency calibration device 100 can be any combination of digital circuitry (e.g., circuitry including metal-oxide-semiconductor field effect transistors (MOSFETs)) and analog circuitry (e.g., circuitry include bipolar junction transistors (BJTs)).

In some embodiments, the target oscillator 110 can be a digitally controlled oscillator (DCO). In other words, the target oscillator 110 can be configured to receive digital bit values (also can be referred to as trim bit values or as frequency bit values) (e.g., binary bit values) that can be used to modify a frequency of the target oscillator signal 10 produced by the target oscillator 110. In some embodiments, the target oscillator 110 can include a network of resistors and/or capacitors that can be used (e.g., activated via fuses, connections, and so forth) to define a frequency of the target oscillator signal 10 based on the frequency bit values. Specifically, the network of resistors and/or capacitors can have configurations (e.g., characteristics) that are modified based on the frequency bit values so that the frequency of the target oscillator signal 10 produced by the target oscillator 110 can be changed in a first direction (e.g., increased) or changed in a second direction (e.g., decreased).

As shown in FIG. 1, a phase frequency detector 120 of a pulse generation unit 150 is configured to receive the reference oscillator signal 12 and the target oscillator signal 10. Specifically, the phase frequency detector 120 is configured to compare a frequency of the target oscillator signal 10 with a frequency of the reference oscillator signal 12. The phase frequency detector 120 is configured to produce one or more indicators of a difference between the frequency of the target oscillator signal 10 and the frequency of the reference oscillator signal 12. For example, the phase frequency detector 120 can be configured to produce a first indicator (or first set of indicators) when the frequency of the target oscillator signal 10 is slower than the frequency of the reference oscillator signal 12. The phase frequency detector 120 can be configured to produce a second indicator (or second set of indicators) when the frequency of the target oscillator signal 10 is faster than the frequency of the reference oscillator signal 12.

A pulse generator 130 included in the pulse generation unit 150 can be configured to produce at least one pulse based on an indicator of a difference between the frequency of the target oscillator signal 10 and the frequency of the reference oscillator signal 12 produced by the phase frequency detector 120. Specifically, the pulse generator 130 is configured to produce one or more pulses configured to trigger an increase in the frequency of the target oscillator signal 10 and/or configured to produce one or more pulses configured to trigger a decrease in the frequency of the target oscillator signal 10. For example, the phase frequency detector 120 can be configured to produce a first indicator (or first set of indicators) when the frequency of the target oscillator signal 10 is slower than the frequency of the reference oscillator signal 12. In response to the first indicator, the pulse generator 130 can be configured to produce at least one pulse configured to trigger the frequency of the target oscillator signal 10 to increase. As another example, the phase frequency detector 120 can be configured to produce a second indicator (or second set of indicators) when the frequency of the target oscillator signal 10 is faster than the frequency of the reference oscillator signal 12. In response to the second indicator, the pulse generator 130 can be configured to produce at least one pulse configured to trigger the frequency of the target oscillator signal 10 to decrease. In some embodiments, a pulse configured to trigger the frequency of the target oscillator signal 10 to increase can be referred to as an increase pulse, and a pulse configured to trigger the frequency of the target oscillator signal 10 to decrease can be referred to as a decrease pulse.

As shown in FIG. 1, the frequency calibration device 100 includes a counter 140 configured to define frequency bit values (e.g., a set of three bit values, a set of two bit values, a set of 8 bit values) configured to define (e.g., control) a frequency of the target oscillator signal 10 produced by the target oscillator 110. In some embodiments, frequency bit values defined by the counter 140 and configured to trigger a frequency of the target oscillator signal 10 produced by the target oscillator 110 can be referred to as a set of frequency bit values.

For example, a first configuration (e.g., first combination) of frequency bit values defined by the counter 140 can be configured to trigger the target oscillator 110 to produce the target oscillator signal 10 at a first frequency (also can be referred to as a first frequency setting). A second configuration of frequency bit values defined by the counter 140 can be configured to trigger the target oscillator 110 to produce the target oscillator signal 10 at a second frequency (also can be referred to as a second frequency setting). Accordingly, the change in a configuration of the frequency bit values from the first configuration to the second configuration can trigger a change in the frequency of the target oscillator signal 10 from the first frequency to the second frequency.

In response to one or more pulses produced by the pulse generator 130 of the pulse generation unit 150, the counter 140 can be configured to modify (e.g., define, modify a configuration of, a combination of) frequency bit values to trigger a change to (e.g., trigger an increase of, trigger a decrease of) a frequency of the target oscillator signal 10. In some embodiments, the counter 140 can be configured to modify one or more bit values included in the frequency bit values to trigger the change to the frequency of the target oscillator signal 10. In some embodiments, the counter 140 can be configured to modify one or more bit values included in the frequency bit values to trigger an incremental change (e.g., a monotonic change, a stepwise change) to the frequency of the target oscillator signal 10. For example, in response to an increase pulse from the pulse generator 130, the counter 140 can be configured to incrementally modify frequency bit values that trigger an increase in the frequency of the target oscillator signal 10. In response to a decrease pulse from the pulse generator 130, the counter 140 can be configured to incrementally modify frequency bit values that trigger a decrease in the frequency of the target oscillator signal 10. In some embodiments, the counter 140 can be configured to modify the frequency bit values to trigger a non-incremental change (e.g., significant and/or non-linear increase or decrease) to the frequency of the target oscillator signal 10.

In some embodiments, the counter 140 can be configured to incrementally modify frequency bit values to a saturation point (e.g., up to a maximum value (without rolling over) represented by the frequency bit values, down to a minimum value (without rolling over) represented by the frequency bit values). For example, if frequency bit values include a three bit value that define a word, the frequency bit values can represent numeric values 0 to 7 (which can correspond with 8 different frequency settings) where 0 is associated with a minimum frequency setting, and 7 can be associated with a maximum frequency setting.

In this embodiment, a frequency of the reference oscillator signal 12 and a frequency of the target oscillator signal 10 are compared on a cycle-by-cycle basis at the phase frequency detector 120. In other words, in some embodiments, each cycle of the reference oscillator signal 12 is compared with at least one cycle of the target oscillator signal 10. In some embodiments, each cycle of the target oscillator signal 10 is compared with at least one cycle of the reference oscillator signal 12. Based on the comparison between a frequency of the target oscillator signal 10 and a frequency of the reference oscillator signal 12, one or more pulses can be produced by the pulse generator 130 that trigger the counter 140 to define frequency bit values that are configured to trigger the target oscillator 110 to increase or decrease the frequency of the target oscillator signal 10. In some embodiments, the methodology applied by the frequency calibration device 100 can take less time to trigger trimming related to the target oscillator 110 than calibration devices including counter-based comparisons of target oscillator signals with reference oscillator signals.

As shown in FIG. 1, at least some portions of the frequency calibration device 100 can define different processing paths P1 and P2, which are illustrated by dashed arrows. In some embodiments, each of the processing paths P1, P2 can be associated with the different directions of frequency change. For example, processing path P1 can be configured to trigger increases in the frequency of the target oscillator signal 10, and processing path P2 can be configured to trigger decreases in the frequency of the target oscillator signal 10. Although not shown in FIG. 1, processing performed by processing path P1 (e.g., a signal produced by processing path P1) can be configured to modify processing performed by processing path P2, and vice versa.

As shown in FIG. 1, the counter 140 is coupled to both the processing path P1 and the processing path P2. Although not shown in FIG. 1, in some embodiments, the processing paths P1, P2 can be multiplexed into the counter 140. Although not shown in FIG. 1, in some embodiments, the phase frequency detector 120 and the pulse generator 130 can collectively define a single processing path (e.g., a single multiplexed processing path) into the counter 140.

Although not shown in FIG. 1, in some embodiments, the processing path P1 and the processing path P2 can be configured to operate based on different clock signals. Accordingly, increase pulses produced by the pulse generator 130 based on processing path P1 can be synchronized with a first clock signal that is different than a second clock signal used by the pulse generator 130 to produce decrease pulses. For example, the processing path P1 can be configured to operate with a timing based on the target oscillator signal 10, and the processing path P2 can be configured to operate with the timing based on the reference oscillator signal 12. In some embodiments, the processing path P1 and the processing path P2 can be configured to operate based on the same clock signal. In some embodiments, one or more clock signals used to trigger processing by the processing path P1 and/or the processing path P2 can be different than the target oscillator signal 10 and/or the reference oscillator signal 12.

In some embodiments, one or more components of the frequency calibration device 100 can be integrated into a single, integrated component. For example, the target oscillator 110, the phase frequency detector 120, the pulse generator 130, and/or the counter 140 can be integrated into a single semiconductor chip. In some embodiments, one or more components of the frequency calibration device 100 can be packaged as a standalone discrete component. In some embodiments, the components of the frequency calibration device 100 may not be integrated into a single component.

In some embodiments, all, or nearly all, of the components of the frequency calibration device 100 can be digitally-based components (rather than analog-based components). For example, the phase frequency detector 120, the pulse generator 130, and/or the counter 140 can be digital components.

FIGS. 2A through 2D are graphs that illustrate a decrease pulse produced by a frequency calibration device, according to an embodiment. In these graphs, time is increasing to the right.

Figure 2A:
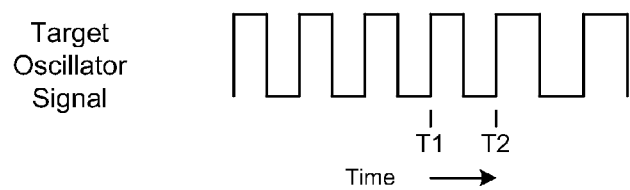
FIGS. 2A through 2D are graphs that illustrate a decrease pulse produced by a frequency calibration device, according to an embodiment.
Figure 2B:
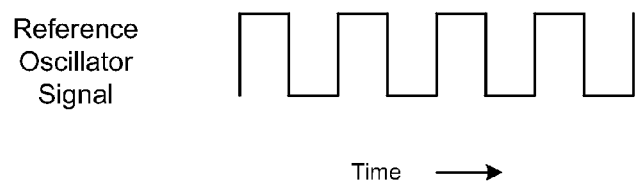

As shown in FIG. 2A, a frequency of a target oscillator signal is greater than a frequency of a reference oscillator signal shown in FIG. 2B. The target oscillator signal can be produced by, for example, the target oscillator 110 shown in FIG. 1, and the reference oscillator signal can be produced by, for example, the reference oscillator 115 shown in FIG. 1.

Figure 2C:
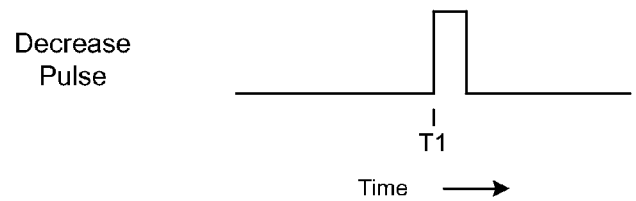

As shown in FIG. 2C, in response to the frequency of the target oscillator signal (shown in FIG. 2A) being greater than the frequency of the reference oscillator signal (shown in FIG. 2B), a decrease pulse is produced starting at approximately time T1. In some embodiments, the difference in the frequency of the reference oscillator signal and the frequency of the target oscillator signal can be identified by the phase frequency detector 120 shown in FIG. 1. In this embodiment, the decrease pulse shown in FIG. 2C is produced based on the target oscillator signal shown in FIG. 2A. Accordingly, the decrease pulse is synchronized with one of the cycles shown in FIG. 2A of the target oscillator signal. Although not shown, in some embodiments, the decrease pulse can be produced based on the reference oscillator signal shown in FIG. 2B rather than based on the target oscillator signal shown in FIG. 2A. In some embodiments, the decrease pulse can be produced by the pulse generator 130 shown in FIG. 1 in response to an indicator of the difference in frequency between the target oscillator signal and the reference oscillator signal produced by the phase frequency detector 120 shown in FIG. 1.

Figure 2D:

In response to the decrease pulse produced at approximately time T1 as shown in FIG. 2C, the frequency of the target oscillator signal decreases at approximately time T2. In other words, the frequency of the target oscillator signal before time T2 is greater than the frequency of the target oscillator signal after time T2. In some embodiments, the frequency of the target oscillator signal shown in FIG. 2A can be decreased based on frequency bit values defined by the counter 140 shown in FIG. 1. Accordingly, the frequency of the target oscillator signal before time T2 can be based on a first configuration of frequency bit values, and the frequency of the target oscillator signal after time T2 can be based on a second configuration of frequency bit values. In this embodiment, because the frequency of the target oscillator signal is greater than the frequency of the reference oscillator signal, an increase pulse is not produced as illustrated in FIG. 2D.

FIGS. 3A through 3D are graphs that illustrate an increase pulse produced by a frequency calibration device, according to an embodiment. In these graphs, time is increasing to the right.

Figure 3A:
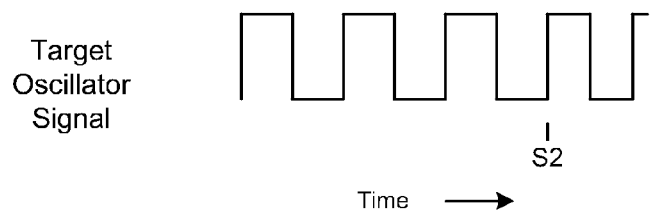
FIGS. 3A through 3D are graphs that illustrate an increase pulse produced by a frequency calibration device, according to an embodiment.
Figure 3B:
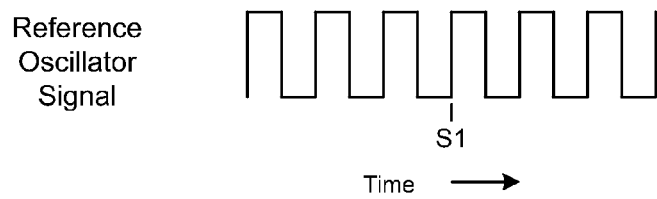

As shown in FIG. 3A, a frequency of a target oscillator signal is less than a frequency of a reference oscillator signal shown in FIG. 3B. The target oscillator signal can be produced by, for example, the target oscillator 110 shown in FIG. 1, and the reference oscillator signal can be produced by, for example, the reference oscillator 115 shown in FIG. 1.

Figure 3C:
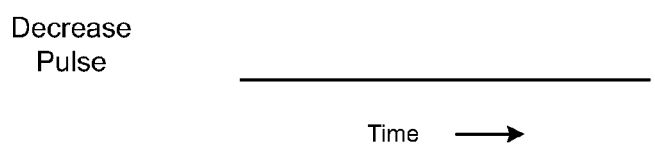
Figure 3D:
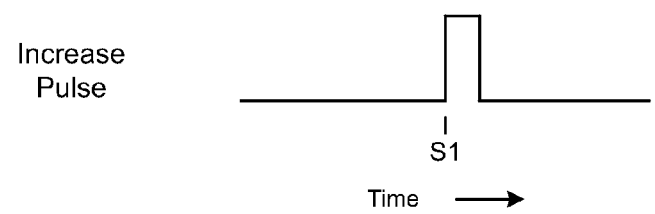

As shown in FIG. 3D, in response to the frequency of the target oscillator signal (shown in FIG. 3A) being less than the frequency of the reference oscillator signal (shown in FIG. 3B), an increase pulse is produced starting at approximately time S1. In some embodiments, the difference in the frequency of the reference oscillator signal and the frequency of the target oscillator signal can be identified by the phase frequency detector 120 shown in FIG. 1. In this embodiment, the increase pulse shown in FIG. 3D is produced based on the reference oscillator signal shown in FIG. 3B. Accordingly, the increase pulse is synchronized with one of the cycles shown in FIG. 3B of the reference oscillator signal. Although not shown, in some embodiments, the increase pulse can be produced based on the target oscillator signal shown in FIG. 3A rather than based on the reference oscillator signal shown in FIG. 3B. In some embodiments, the increase pulse can be produced by the pulse generator 130 shown in FIG. 1 in response to an indicator of the difference in frequency between the target oscillator signal and the reference oscillator signal produced by the phase frequency detector 120 shown in FIG. 1.

In response to the increase pulse produced at approximately time S1 as shown in FIG. 3D, the frequency of the target oscillator signal shown in FIG. 3A is increased at approximately time S2. In other words, the frequency of the target oscillator signal before time S2 is less than the frequency of the target oscillator signal after time S2. In some embodiments, the frequency of the target oscillator signal shown in FIG. 3A can be increased based on frequency bit values defined by the counter 140 shown in FIG. 1. Accordingly, the frequency of the target oscillator signal before time S2 can be based on a first configuration of frequency bit values, and the frequency of the target oscillator signal after time S2 can be based on a second configuration of frequency bit values. In this embodiment, because the frequency of the target oscillator signal is greater than the frequency of the reference oscillator signal, a decrease pulse is not produced as shown in FIG. 3C.

FIGS. 4A through 4D are graphs that illustrate several increase pulses produced by a frequency calibration device, according to an embodiment. In these graphs, time is increasing to the right.

Figure 4A:
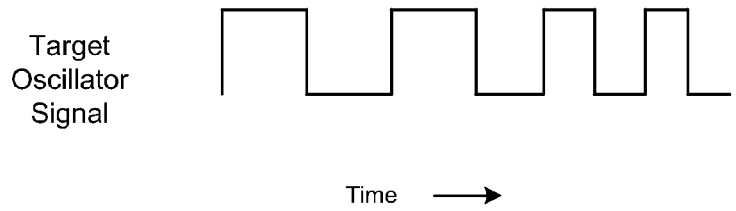
FIGS. 4A through 4D are graphs that illustrate several increase pulses produced by a frequency calibration device, according to an embodiment.
Figure 4B:
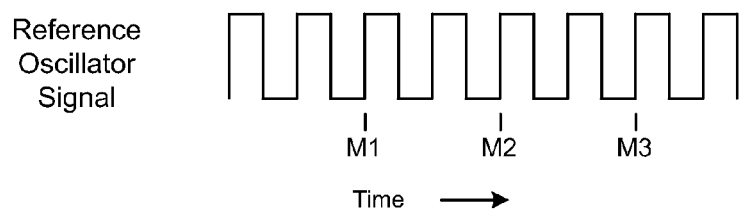

As shown in FIG. 4A, a frequency of a target oscillator signal is less than a frequency of a reference oscillator signal shown in FIG. 4B. In this embodiment, the frequency of the target oscillator signal shown in FIG. 4A is less than 2 times the frequency of the reference oscillator signal shown in FIG. 4B. The target oscillator signal can be produced by, for example, the target oscillator 110 shown in FIG. 1, and the reference oscillator signal can be produced by, for example, the reference oscillator 115 shown in FIG. 1.

Figure 4C:
Figure 4D:
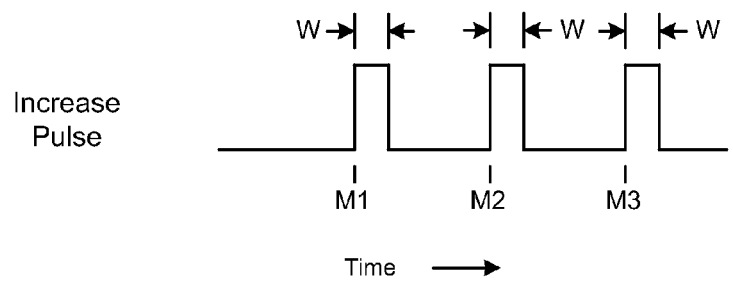

As shown in FIG. 4D, in response to the frequency of the target oscillator signal (shown in FIG. 4A) being less than the frequency of the reference oscillator signal (shown in FIG. 4B), increase pulses are triggered starting at approximately times M1, M2, and M3. In some embodiments, the differences in the frequency of the reference oscillator signal and the frequency of the target oscillator signal can be identified by the phase frequency detector 120 shown in FIG. 1. In this embodiment, the increase pulses shown in FIG. 4D are produced based on the reference oscillator signal shown in FIG. 4B. Accordingly, each of the increase pulses are synchronized with one of the cycles shown in FIG. 4B in the reference oscillator signal. Because each of the increase pulses are synchronized with the reference oscillator signal shown in FIG. 4B, the increase pulses have the same (or approximately the same) pulse width W.

In this embodiment, the increase pulses shown in FIG. 4D are produced based on every other cycle within the reference oscillator signal shown in FIG. 4B. Although not shown, in some embodiments, increase pulses can be produced in response to every cycle so that the target oscillator signal can be increased more rapidly than shown in FIG. 4A. Although not shown, in some embodiments, increase pulses can be produced in response to or based on more than every other cycle within the target oscillator signal. In some embodiments, decrease pulses can be produced based a specified time interval, randomly, after a specified delay, based on a specified number of cycles, and/or so forth.

Although not shown, in some embodiments, at least some of the increase pulses can be produced based on the target oscillator signal shown in FIG. 4A rather than based on the reference oscillator signal shown in FIG. 4B. In such embodiments, the increase pulses (e.g., each of the increase pulses) may have different (or decreasing) pulse widths because of the changing frequency of the target oscillator signal. In some embodiments, the increase pulses can be produced by the pulse generator 130 shown in FIG. 1 in response to an indicator of the difference in frequency between the target oscillator signal and the reference oscillator signal produced by the phase frequency detector 120 shown in FIG. 1.

In response to the increase pulses produced at approximately times M1 through M3 as shown in FIG. 4D, the frequency of the target oscillator signal shown in FIG. 4A is incrementally increased. In some embodiments, the frequency of the target oscillator signal shown in FIG. 4A can be increased based on incremental changes to frequency bit values defined by the counter 140 shown in FIG. 1. In this embodiment, because the frequency of the target oscillator signal is greater than the frequency of the reference oscillator signal, a decrease pulse is not produced as shown in FIG. 4C.

FIGS. 5A through 5D are graphs that illustrate several decrease pulses produced by a frequency calibration device, according to an embodiment. In these graphs, time is increasing to the right.

Figure 5A:
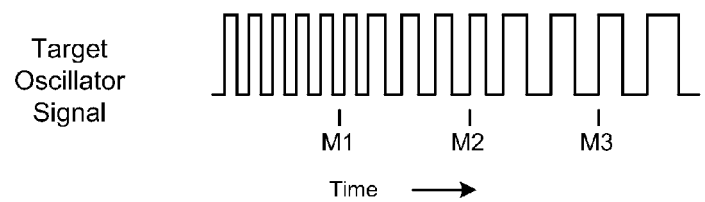
FIGS. 5A through 5D are graphs that illustrate several decrease pulses produced by a frequency calibration device, according to an embodiment.
Figure 5B:
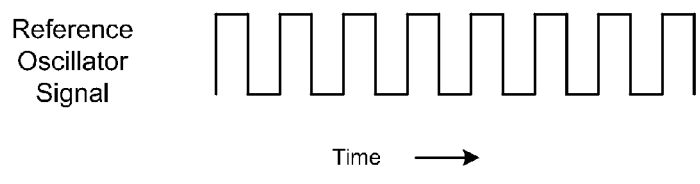

As shown in FIG. 5A, a frequency of a target oscillator signal is greater than a frequency of a reference oscillator signal shown in FIG. 5B. In this embodiment, the frequency of the target oscillator signal shown in FIG. 5A is initially less than 2 times the frequency of the reference oscillator signal shown in FIG. 5B. The target oscillator signal can be produced by, for example, the target oscillator 110 shown in FIG. 1, and the reference oscillator signal can be produced by, for example, the reference oscillator 115 shown in FIG. 1.

Figure 5C:
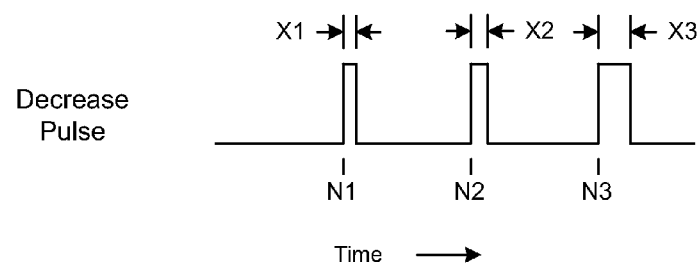

As shown in FIG. 5C, in response to the frequencies of the target oscillator signal (shown in FIG. 5A) being greater than the frequencies of the reference oscillator signal (shown in FIG. 5B), decrease pulses are triggered starting at approximately times N1, N2, and N3. In some embodiments, the differences in the frequency of the reference oscillator signal and the frequency of the target oscillator signal can be identified by the phase frequency detector 120 shown in FIG. 1. In this embodiment, the decrease pulses shown in FIG. 5C are produced based on the target oscillator signal shown in FIG. 5A. Accordingly, each of the decrease pulses are synchronized with one of the cycles shown in FIG. 5A in the target oscillator signal. Because each of the decrease pulses are synchronized with the changing target oscillator signal shown in FIG. 5B, the increase pulses have different (e.g., increasing) pulse widths X1 through X3.

In this embodiment, the decrease pulses shown in FIG. 5C are produced periodically based on cycles within the target oscillator signal shown in FIG. 5A. Although not shown, in some embodiments, decrease pulses can be produced in response to every cycle so that the target oscillator signal can be increased more rapidly than shown in FIG. 5A. Although not shown, in some embodiments, increase pulses can be produced based every other cycle within the target oscillator signal. In some embodiments, increase pulses can be produced based a specified time interval, randomly, after a specified delay, based on a specified number of cycles, and/or so forth.

Although not shown, in some embodiments, at least some of the decrease pulses can be produced based on the reference oscillator signal shown in FIG. 5B rather than based on the target oscillator signal shown in FIG. 5A. In such embodiments, the decrease pulses (e.g., each of the decrease pulses) may have the same (or substantially the same) pulse widths because of the uniform frequency of the reference oscillator signal. In some embodiments, the decrease pulses can be produced by the pulse generator 130 shown in FIG. 1 in response to an indicator of the difference in frequency between the target oscillator signal and the reference oscillator signal produced by the phase frequency detector 120 shown in FIG. 1.

Figure 5D:

In response to the decrease pulses produced at approximately times N1 through N3 as shown in FIG. 5C, the frequency of the target oscillator signal shown in FIG. 5A is incrementally decreased. In some embodiments, the frequency of the target oscillator signal shown in FIG. 5A can be decreased based on incremental changes to frequency bit values defined by the counter 140 shown in FIG. 1. In this embodiment, because the frequency of the target oscillator signal is less than the frequency of the reference oscillator signal, an increase pulse is not produced as shown in FIG. 5D.

Figure 6:
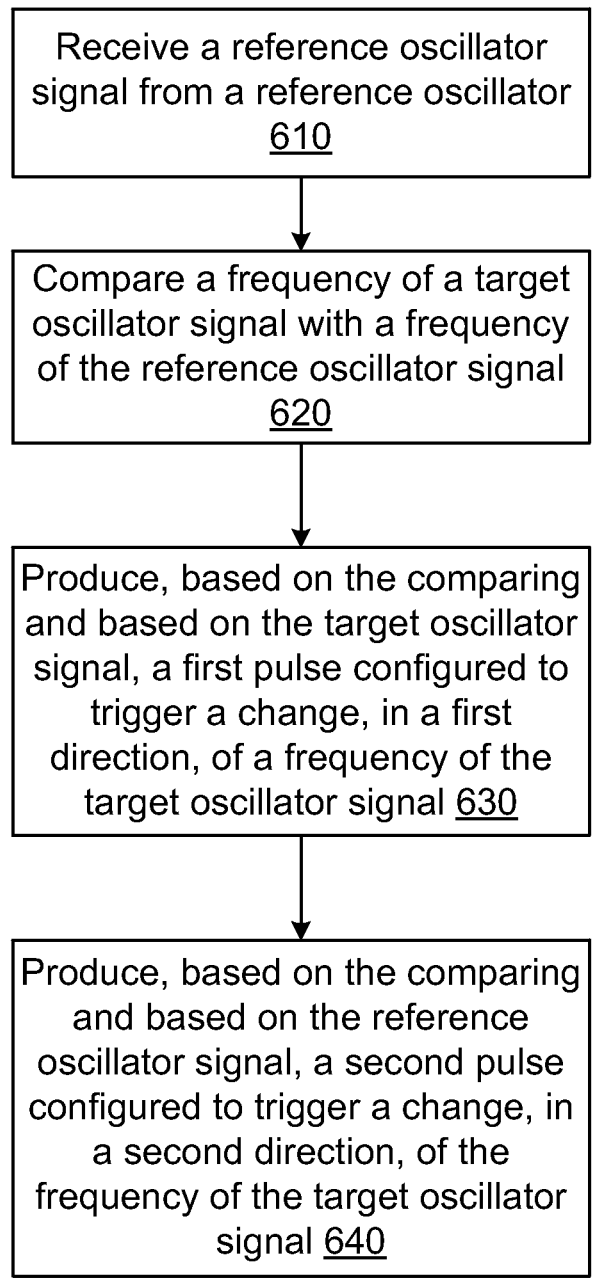
FIG. 6 is a flowchart that illustrates a method for calibration of a target oscillator signal produced by a target oscillator.

FIG. 6 is a flowchart that illustrates a method for calibration of a target oscillator signal produced by a target oscillator. In some embodiments, one or more portions of the flowchart can be performed by, for example, the frequency calibration device 100 shown in FIG. 1. In some embodiments, at least some portions of the flowchart can define at least a portion of a calibration procedure performed during, for example, a testing procedure.

A reference oscillator signal is received from a reference oscillator (block 610). In some embodiments, the reference oscillator signal can be produced by the reference oscillator 115 shown in FIG. 1. In some embodiments, the reference oscillator signal can be received at phase frequency detector 120 shown in FIG. 1.

A frequency of a target oscillator signal is compared with a frequency of the reference oscillator signal (block 620). In some embodiments, the target oscillator signal can be produced by the target oscillator 110 shown in FIG. 1. In some embodiments, the frequency of the target oscillator signal can be compared with the frequency of the reference oscillator signal by the phase frequency detector 120 shown in FIG. 1.

A first pulse configured to trigger a change, in a first direction, of a frequency of the target oscillator signal is produced based on the comparing and based on the target oscillator signal (block 630). In such embodiments, the target oscillator signal can function as a clock signal. In some embodiments, the first pulse can be triggered by the pulse generator 130 shown in FIG. 1. In some embodiments, the first direction can be a decrease and the first pulse can be a decrease pulse.

A second pulse configured to trigger a change, in a second direction, of the frequency of the target oscillator signal is produced based on the comparing and based on the reference oscillator signal (block 640). In such embodiments, the reference oscillator signal can function as a clock signal. In some embodiments, the second pulse can be triggered by the pulse generator 130 shown in FIG. 1. In some embodiments, the second direction can be an increase and the second pulse can be an increase pulse. The first pulse or the second pulse can be configured to cause a change in frequency bit values (e.g., a counter value) that can be stored and used to trigger a change in a frequency of the target oscillator signal.

FIG. 7 illustrates frequency bit values 700 associated with a target oscillator signal, according to an embodiment. The frequency bit values include bit values B0 through B2, where bit value B0 is the least significant bit value and bit value B2 is the most significant bit value. Because the frequency bit values include three bit values, a total of eight distinct frequency settings (which can define a series or sequence of frequency settings) associated with the target oscillator signal can be defined based on the frequency bit values. In some embodiments, the frequency bit values can be defined, at least in part, by a counter such as the counter 140 shown in FIG. 1. In some embodiments, the frequency bit values can be referred to as trim bit values or as a frequency word.

Also as shown in FIG. 7, each configuration (e.g., combination) of frequency bit values is associated with a frequency 710 and corresponding period 720 (e.g., cycle period) of a target oscillator signal produced by target oscillator (e.g., the target oscillator 110 shown in FIG. 1). In this embodiment, the frequency 710 and period 720 of the target oscillator signal are referenced to an initial frequency and period, respectively, when the frequency bit values are at a default configuration of "000" (which can correspond with a numeric value of zero). A change from the frequency bit values of "000" to another configuration of frequency bit values will trigger a change in the frequency 710 of the target oscillator signal and a change in the period 720 of the target oscillator signal.

For example, a change from the frequency bit values of "000" to the frequency bit values of "111" (which can correspond with a numeric value of 7) will trigger a decrease in the frequency 710 of the target oscillator signal by 8.6% and an increase in the period 720 of the target oscillator signal by 9.4%. As another example, a change from the frequency bit values of "001" (which can correspond with a numeric value of 1) to the frequency bit values of "010" (which can correspond with a numeric value of 2) will trigger an increase in the frequency 710 of the target oscillator signal from 8.1% up to 17.7% and a decrease in the period 720 of the target oscillator signal from −7.5% to −15.0%. In some embodiments, each of the frequencies 710 associated with each of the configurations of frequency bit values 700 can be referred to as frequency settings, frequency steps, or as frequency increments.

In this embodiment, the frequency bit value configuration of "000" can be a default or initial frequency bit value configuration. In some embodiments, the default or initial frequency bit value configuration can be different from "000". For example, the default or initial frequency bit value configuration can be "100".

As illustrated in FIG. 7, changes to the frequency bit values 700 can result in nonlinear changes to the frequency 710 and/or period 720 of the target oscillator signal. For example, a change in the frequency bit values 700 from "000" to "001" can trigger a 8.1% increase in the frequency 710, but a change in the frequency bit values 700 from "001" to "010" can trigger a 9.6% change (from 8.1% to 17.7%) in the frequency 710. In some embodiments, incremental changes to the frequency bit value 700 can result in linear changes to the frequency 710 and/or the period 720.

In some embodiments, changes in the frequency bit values can be performed (e.g., performed by the counter 140 in response to the pulse generator 130 shown in FIG. 1) so that changes are performed in a stepwise fashion. For example, the frequency bit values can be triggered to change from "000" to "101" (which can correspond with a numeric value of five) through "110" (which can correspond with a numeric value of six) by a frequency calibration device (e.g., frequency calibration device 100 shown in FIG. 1). In some embodiments, the frequency bit values can be triggered to change directly from "000" to "101" without going through "110" by a frequency calibration device (e.g., frequency calibration device 100 shown in FIG. 1). Although the example illustrated in FIG. 7 includes a total of three frequency bit values, in some embodiments, a set of frequency bit values can include more than a total of three bit values (e.g., a byte, 15 bit values) or less than a total of three bit values (e.g., two bit values).

Figure 8A:
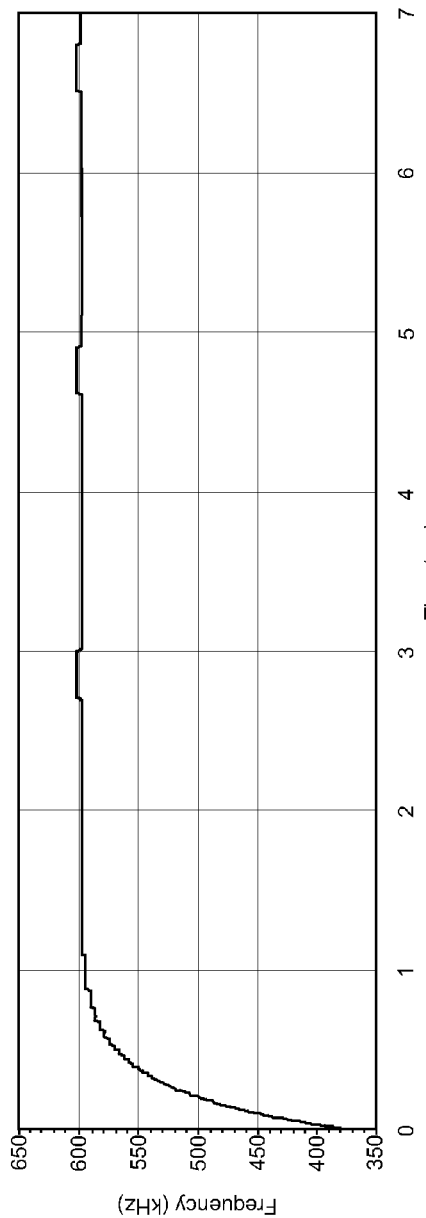
FIG. 8A is a graph that illustrates a frequency of a target oscillator signal.
Figure 8B:
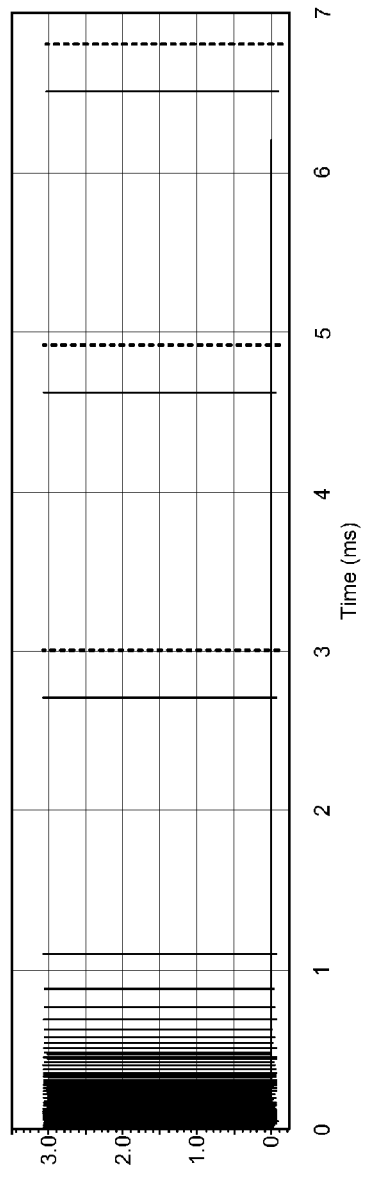
FIG. 8B is a graph that illustrates pulses configured to trigger changes in the frequency of the target oscillator signal shown in FIG. 8A.

FIG. 8A is a graph that illustrates a frequency of a target oscillator signal, and FIG. 8B is a graph that illustrates pulses configured to trigger changes in the frequency of the target oscillator signal shown in FIG. 8A. As shown in FIGS. 8A and 8B, time is increasing to the right in milliseconds (ms) starting at approximately 0 ms. In some embodiments, the target oscillator signal can be associated with a target oscillator of the frequency calibration device. FIGS. 8A and 8B illustrate operation of, for example, the components of the frequency calibration device 100 as a calibration loop or as a feedback loop.

As shown in FIG. 8A, the frequency of the target oscillator signal starts at approximately 380 kHz at approximately 0 ms. Although not shown, the frequency of the target oscillator signal is being calibrated to a reference oscillator signal at a frequency of 600 kHz. As shown in FIG. 8B, increase pulses are illustrated with solid lines, and decrease pulses are illustrated with dashed lines. In some embodiments, the increase pulses can be triggered via a first processing path of a frequency calibration device and the decrease pulses can be triggered via a second processing path of the frequency calibration device.

Because the frequency of the target oscillator signal is significantly below the frequency of the reference oscillator signal starting at approximately 0 ms (shown in FIG. 8A), several increase pulses are produced between approximately 0 ms and 3 ms as shown in FIG. 8B. As the frequency of the target oscillator signal approaches the reference oscillator signal at 600 kHz as shown in FIG. 8A, the rate at which increase pulses are produced decreases as shown in FIG. 8B.

The increase pulses trigger incremental increases in the frequency of the target oscillator signal (via frequency bit values) as shown in FIG. 8A until the frequency of the target oscillator signal exceeds the frequency of the reference oscillator signal at approximately 2.7 ms. In response to the target oscillator signal exceeding the reference oscillator signal, a decrease pulse produced at approximately 3 ms causes the frequency of the target oscillator signal to fall below reference oscillator signal.

As shown in FIG. 8A, the frequency of the target oscillator signal is moved (between approximately 2.7 ms and 6.8 ms) (e.g., toggled) between a frequency slightly below the frequency of the reference oscillator signal and a frequency slightly above the frequency of the reference oscillator signal in response to decrease pulses and increase pulses, respectively (shown in FIG. 8B). Accordingly, the movement between the frequencies can be triggered by different processing paths of, for example, a frequency calibration device.

In this embodiment, the frequency of the target oscillator signal moves between frequencies increments adjacent to, but not exactly at, the frequency of the reference oscillator signal because the frequency bit values are limited in frequency resolution (that can be triggered by the frequency bit values). Accordingly, in this embodiment, the frequency calibration device can be configured to define frequency bit values that set the frequency of the target oscillator signal within a frequency increment (e.g., a frequency step, a least significant bit value) of the frequency of the reference oscillator signal. In some embodiments, the frequency calibration device can be configured to define frequency bit values that set the frequency of the target oscillator signal within a threshold frequency (e.g., at the closest frequency increment) to the reference oscillator signal. In some embodiments, when the frequency calibration device has defined frequency bit values that set the frequency of the target oscillator signal within a frequency increment or within a threshold frequency of the frequency of the reference oscillator signal, the frequency calibration can be referred to as converging.

In some embodiments, a frequency calibration device can be configured to set the frequency of the target oscillator signal at a frequency within at least one frequency increment of the reference oscillator signal after a calibration time period has expired. In such embodiments, the frequency of the target oscillator signal may not be set at the closest of two frequency increments to the reference oscillator signal, but may still be set at a frequency that is within one frequency increment of the frequency of the reference oscillator signal. This situation can arise when the frequency of the target oscillator signal is bouncing (e.g., toggling) between a first frequency increment and a second frequency increment around the reference oscillator signal where the first frequency increment is closer to the reference oscillator signal (in frequency value) than the second frequency increment. If the calibration time period expires when the frequency bit values are triggering the target oscillator signal to be at the second frequency increment, the target oscillator signal can be set at the second frequency increment (which is farther from the reference oscillator signal than the first frequency increment but is still within a frequency increment of the reference oscillator signal).

Figure 9:
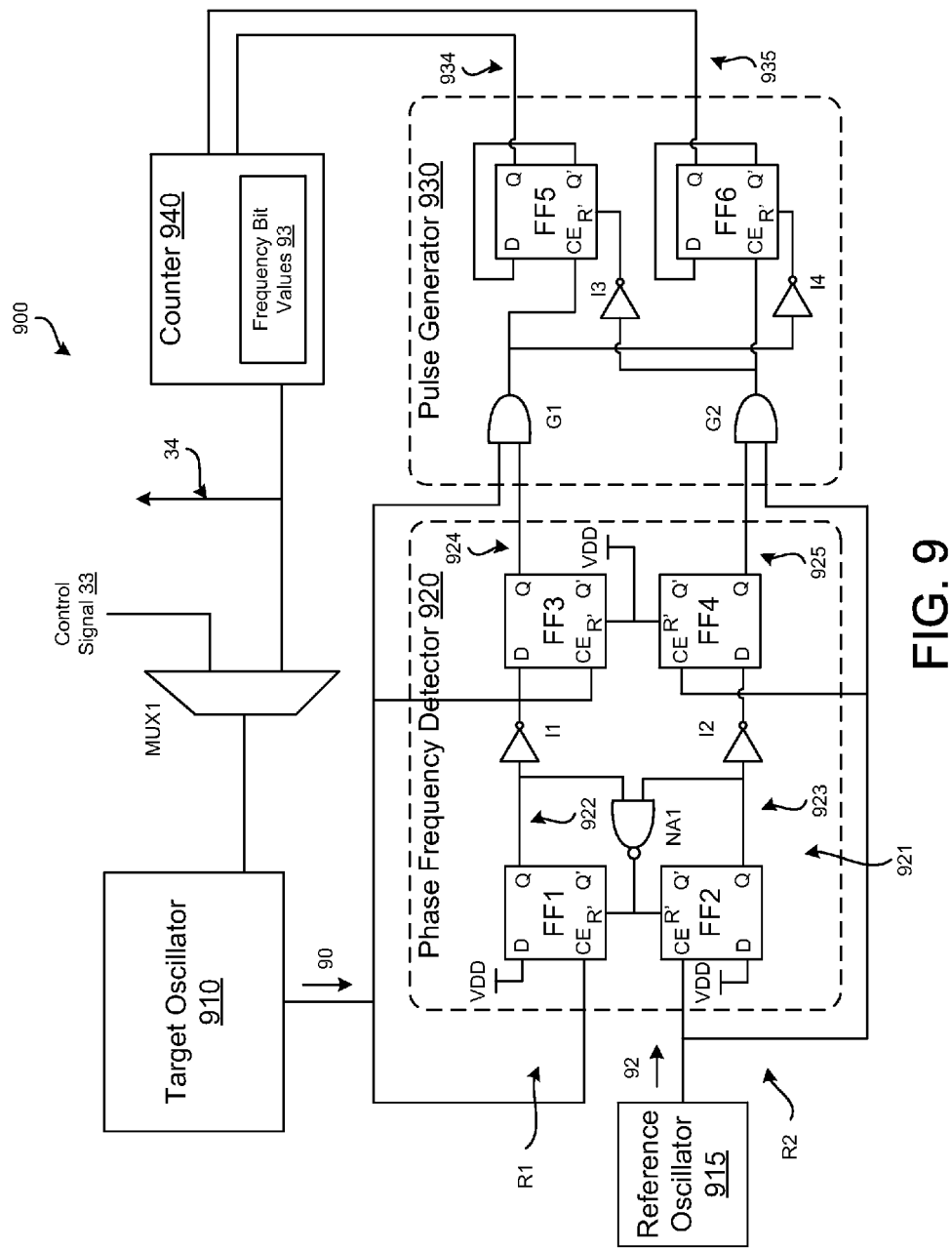
FIG. 9 is a diagram that illustrates an example of a frequency calibration device, according to embodiment.

FIG. 9 is a diagram that illustrates an example of a frequency calibration device 900, according to embodiment. As shown in FIG. 9, the frequency calibration device 900 includes a target oscillator 910 configured to be calibrated against a reference oscillator 915. Specifically, a frequency of a target oscillator signal 90 produced by the target oscillator 910 is configured to be calibrated against a frequency of a reference oscillator signal 92 produced by the reference oscillator 915. In some embodiments, the target oscillator 910, which can be a digitally controlled oscillator (DCO), can be configured to produce the target oscillator signal 90 based on frequency bit values.

As shown in FIG. 9, a phase frequency detector 920 (which can be included in a pulse generation unit) is configured to receive the target oscillator signal 90 and the reference oscillator signal 92. The phase frequency detector 920 is configured to compare a frequency of the target oscillator signal 90 with a frequency of the reference oscillator signal 92. Based on the comparison performed by the phrase frequency detector 920, a pulse generator 930 (which can be included in a pulse generation unit) can be configured to produce at least one pulse configured to trigger an increase in the frequency of the target oscillator signal 90 (e.g., an increase pulse) and/or configured to trigger a decrease in the frequency of the target oscillator signal 90 (e.g., a decrease pulse). As shown in FIG.

9, the frequency calibration device 900 also includes a counter 940 configured to define frequency bit values 93 based on increase pulses and/or decrease pulses received from the pulse generator 930. The frequency bit values 93 can be sent to the target oscillator 910 via multiplexer MUX1 to trigger the target oscillator to produce the target oscillator signal 90 based on a frequency corresponding with the frequency bit values 93. As discussed above, the counter 940 can be configured as a saturating counter that defines the frequency bit values 93 up to a saturating value (e.g., maximum value and/or a minimum value) without rolling over.

As shown in FIG. 9, at least some portions of the frequency calibration device 900 can define different processing paths R1 and R2. The processing path R1 includes (or is defined at least in part by) flip-flops FF1, FF3, and FF5, and the processing path R2 includes (or is defined at least in part by) flip-flops FF2, FF4, and FF6. In some embodiments, the flip-flops can be referred to as latches. Each of the processing paths R1, R2 can be associated with the different directions of frequency change. In this example embodiment, processing path R1 is configured to trigger decreases in the frequency of the target oscillator signal 90, and processing path R2 is configured to trigger increases in the frequency of the target oscillator signal 90. In some embodiments, because the processing path R1 is configured to trigger decreases (via decrease pulses) in the frequency of the target oscillator signal 90, the processing R1 can be referred to as a down or decrease processing path. In some embodiments, because the processing path R2 is configured to trigger increases (via increase pulses) in the frequency of the target oscillator signal 90, the processing R2 can be referred to as an up or increase processing path. Although not shown in FIG. 9, at some of the flip-flops FF1 through FF6 can be, or can be configured to include more than one flip-flop such as a master flip-flop and a slave flip-flop.

As shown in FIG. 9, the processing path R1 is configured to operate based on the target oscillator signal 90 as a clock signal and the processing path R2 is configured to operate based on the reference oscillator signal 92 as a clock signal. As shown in FIG. 9, the target oscillator signal 90 is received at each of the flip-flops (i.e., flip-flops FF1, FF3, and FF5) associated with the processing path R1, and the reference oscillator signal 92 is received at each of the flip-flops (i.e., flip-flops FF2, FF4, and FF6) associated with the processing path R2. Accordingly, decrease pulses produced by the pulse generator 930 (at output 934) based on processing path R1 can be synchronized with the target oscillator signal 90, and increase pulses produced by the pulse generator 930 (at output 935) based on processing path R2 can be synchronized with the target oscillator signal 90. In some embodiments, one or more of the flip-flops shown in FIG. 9 can be configured to receive (and operate based on) a clock signal different than the target oscillator signal 90 and/or reference oscillator signal 92.

As shown in FIG. 9, the phase frequency detector 920 is a quad-D phase frequency detector. The quad-D phase frequency detector includes a dual-D phase frequency detector portion, which includes flip-flop FF1, flip-flop FF2, and a NAND gate NA1. The dual-D phase frequency detector portion 921 is configured to produce indicators at outputs 922, 923. The target oscillator signal 90 is received at flip-flop FF1, and the reference oscillator signal 92 is received at flip-flop FF2. The dual-D phase frequency detector portion 921 is configured to produce an indicator (e.g., a pulse) at a rising edge of the target oscillator signal 90 and an indicator (e.g., a falling edge of the pulse) in response to a rising edge of the reference oscillator signal 92, and vice versa (depending on which of the signals is received first). As shown in FIG. 9, the respective outputs 922, 923 of the dual-D phase frequency detector portion 921 are coupled to the flip-flops FF3, FF4 via the inverters I1, I2. In this embodiment, the quad-D phase frequency detector (i.e., the phase frequency detector 920) is configured to produce static high or static low indicators at outputs 924, 925 when the frequency of the target oscillator signal 90 is approximately two times the frequency of the reference oscillator signal 92 or approximately one-half of the frequency of the reference oscillator signal 92.

Because the counter 940 can use an edge (e.g., a clock edge) to count down or up when defining the frequency bit values 93, the respective clock signals (i.e., target oscillator signal 90 and reference oscillator signal 92) to the decrease processing path R1 and the increase processing path R2 are coupled via AND gate G1 and AND gate G2, respectively. Accordingly, a decrease pulse on the output 934 from the flip-flop FF5 of the pulse generator 930 can be synchronized with the target oscillator signal 90. Also, an increase pulse on the output 935 from the flip-flop FF6 of the pulse generator 930 can be synchronized with the reference oscillator signal 92. As shown in FIG. 9, the processing path R1 and the processing path R2 within the pulse generator 930 are coupled via the inverters I3 and I4, respectively. The inverters I3 and I4, respectively, can be configured to trigger resetting (via R' (e.g., reset bar)) of flip-flop FF5 and flip-flop FF6 so that pulses may not be produced at outputs 934, 935 during overlapping time periods (e.g., simultaneously). In other words, the outputs 934, 935 are configured to produce pulses during mutually exclusive (e.g., non-overlapping) time periods.

As shown in FIG. 9, the multiplexer MUX1 is controlled via a control signal 33. The control signal 33 can be configured to trigger the multiplexer MUX1 to send at the frequency bit values 93 defined at the counter 942 the target oscillator 910, thereby maintaining a frequency of or triggering a change in the frequency of the target oscillator signal 90.

In some embodiments, after calibration of the frequency of the target oscillator signal 90 with the frequency of the reference oscillator signal 92 has been completed, the frequency bit values 93 can be, for example, stored in a memory, used to blow one or more fuses (e.g., change one or more interconnections) to set the frequency of the target oscillator signal 92, and/or so forth, via path 34. In some embodiments, calibration of the frequency of the target oscillator signal 90 with the frequency of the reference oscillator signal 92 can be performed during a calibration time period. In some embodiments, calibration of the frequency of the target oscillator signal 90 with the frequency of the reference oscillator signal 92 can be terminated in response to the frequency bit values 93 saturating.

Although not shown in FIG. 9, in some embodiments, the target oscillator signal 90 into flip-flop FF1 can be inverted (via an inverter) and reference oscillator signal 92 into flip-flop FF2 can also be inverted (via an inverter). In such embodiments, the inverter I1 and the inverter I2 can optionally be removed.

Although not shown in FIG. 9, in some embodiments, decrease pulses sent via the output 934 and increase pulses sent via the output 935 can be provided to the counter 940 via an OR gate. Although not shown in FIG. 9, in some embodiments, a delay circuit, which can cause a delay in the feedback loop define by the components of the frequency calibration device 900, can be inserted between the pulse generator 930 and the counter 940.

FIGS. 10A through 10I are graphs that illustrate operation of a frequency calibration device. As shown in FIG. 10F, a frequency of a target oscillator signal is decreased starting at approximately time C2 in response to decrease pulses shown in FIG. 10G. The decrease pulses are produced based on a comparison of a target oscillator signal shown in FIG. 10B and a reference oscillator signal shown in FIG. 10A. The target oscillator frequency is toggled (starting at approximately time C4) between frequency increments as illustrated by the staggering of decrease pulses (at approximately times C4, C6 and C8) and increase pulses (at approximately times C5 and C7) as illustrated in FIGS. 10G and 10I, respectively. FIGS. 10C through 10E illustrate frequency bit values B0 through B2, respectively, used to trigger the frequency of the target oscillator signal shown in FIGS. 10B and 10F. In some embodiments, the frequency bit values B0 through B2 can correspond with the frequency bit values 700 shown in FIG. 7. In this embodiment, the decrease pulses (shown in FIG. 10G) and the increase pulses (shown in FIG. 10I) are combined to produce a clock signal (shown in FIG. 10H) to a counter.

In this embodiment, comparison of the frequency of the target oscillator signal (shown in FIG. 10B) with the frequency of the reference oscillator signal (shown in FIG. 10A) is initiated starting at approximately time C1 after a time period between time C0 and time C1. In some embodiments, during the time period between times C0 and C1, increase pulses are repeatedly produced as shown in FIG. 10I. Accordingly, the target oscillator frequency is momentarily increased in response to the increase pulses between time C1 and C2 as shown in FIG. 10F until the decrease pulses are produced starting at approximately times C2 as shown in FIG. 10G.

In some embodiments, the frequency calibration device can be configured to converge within a few microseconds (e.g., 10 microseconds, 50 microseconds, 200 microseconds). In some embodiments, the convergence time can be less than a few microseconds (e.g., 10 nanoseconds) or greater than a few microseconds (e.g., 10 milliseconds, 100 milliseconds) For example, the time between time C1 (when comparison is started) and time C4 (when convergences has occurred) can be approximately 50 milliseconds.

FIGS. 11, 12, and 13 are graphs that illustrate operation of a frequency calibration device (e.g., frequency calibration device 100 shown in FIG. 1, frequency calibration device 900 shown in FIG. 9) based on different frequencies of a target oscillator signal. Specifically, FIGS. 11A through 11J are associated with a target oscillator signal having an initial frequency slightly faster than a frequency of a reference oscillator signal. In some embodiments, the target oscillator signal associated with FIGS. 11A through 11J can be produced based on a slightly fast semiconductor process or a fast variation from a typical semiconductor process. FIGS. 12A through 12J are associated with a target oscillator signal having an initial frequency slower than a frequency of a reference oscillator signal. In some embodiments, the target oscillator signal associated with FIGS. 12A through 12J can be produced based on a slow semiconductor process or a slow variation from a typical semiconductor process. FIGS. 13A through 13J are associated with a target oscillator signal having an initial frequency significantly faster than a frequency of a reference oscillator signal. In some embodiments, the target oscillator signal associated with FIGS. 13A through 13J can be produced based on a fast semiconductor process or a significantly fast variation from a typical semiconductor process.

As shown in FIG. 11B, a target oscillator signal is started (e.g., enabled) at approximately time D1. In this embodiment, a frequency of the target oscillator signal shown in FIG. 13B is slower than a frequency of a reference clock signal shown in FIG. 13A. In this embodiment, before the target oscillator signal is started, increase pulses are triggered as shown in FIG. 11H. In response to a comparison of a frequency of the target oscillator signal (shown in FIG. 11B) with a frequency of a reference oscillator signal (shown in 11A) decrease pulses are triggered as shown in FIG. 11I. The target oscillator frequency is toggled between frequency increments as illustrated by the staggering of increase pulses and decrease pulses as illustrated in FIGS. 11H and 11I, respectively. FIG. 11J illustrates frequency settings (which can be defined by bit values) used to trigger the frequency of the target oscillator signal shown in FIG. 11B. As shown in FIG. 11J, the frequency settings toggle between "6" and "7" starting at approximately time D2 (in response to the staggered increase pulses and decrease pulses). In some embodiments, the frequency settings shown in FIG. 11J can correspond with numeric values represented by the frequency bit values 700 shown in FIG. 7. In this embodiment, the increase pulses (shown in FIG. 11H) and the decrease pulses (shown in FIG. 11I) are combined to produce a clock signal (shown in FIG. 11G) to a counter.

An output of a dual-D phase detector that is part of an increase processing path of a quad-D phase frequency detector is shown in FIG. 11C (e.g., output 923 of the dual-D phase detector portion 921 shown in FIG. 9), and an output of a dual-D phase detector that is part of a decrease processing path of a quad-D phase frequency detector is shown in FIG. 11D (e.g., output 922 of the dual-D phase detector portion 921 shown in FIG. 9). Also, an output of an increase processing path of a quad-D phase frequency detector is shown in FIG. 11D (e.g., output 925 of the phase detector 920 shown in FIG. 9), and an output of a decrease processing path of a quad-D phase frequency detector is shown in FIG. 11E (e.g., output 924 of the phase detector 920 shown in FIG. 9).

As shown in FIG. 12B, a target oscillator signal is started (e.g., enabled) at approximately time E1. In this embodiment, a frequency of the target oscillator signal shown in FIG. 14B is slower than a frequency of a reference clock signal shown in FIG. 14A. In this embodiment, before the target oscillator signal is started, increase pulses are triggered as shown in FIG. 12H. In response to a comparison of the frequency of the target oscillator signal (shown in FIG. 12B) with the frequency of the reference oscillator signal (shown in 12A) decrease pulses are triggered as shown in FIG. 12I. The target oscillator frequency is toggled between frequency increments as illustrated by the staggering of increase pulses and decrease pulses as illustrated in FIGS. 12H and 12I, respectively. FIG. 12J illustrates frequency settings (which can be defined by bit values) used to trigger the frequency of the target oscillator signal shown in FIG. 12B. As shown in FIG. 12J, the frequency settings toggle between "1" and "2" starting at approximately time E2 (in response to the staggered increase pulses and decrease pulses). In some embodiments, the frequency settings shown in FIG. 12J can correspond with numeric values represented by the frequency bit values 700 shown in FIG. 7. In this embodiment, the increase pulses (shown in FIG. 12H) and the decrease pulses (shown in FIG. 12I) are combined to produce a clock signal (shown in FIG. 12G) to a counter.

An output of a dual-D phase detector that is part of an increase processing path of a quad-D phase frequency detector is shown in FIG. 12C (e.g., output 923 of the dual-D phase detector portion 921 shown in FIG. 9), and an output of a dual-D phase detector that is part of a decrease processing path of a quad-D phase frequency detector is shown in FIG. 12D (e.g., output 922 of the dual-D phase detector portion 921 shown in FIG. 9). Also, an output of an increase processing path of a quad-D phase frequency detector is shown in FIG. 12D (e.g., output 925 of the phase detector 920 shown in FIG. 9), and an output of a decrease processing path of a quad-D phase frequency detector is shown in FIG. 12E (e.g., output 924 of the phase detector 920 shown in FIG. 9).

As shown in FIG. 13B, a target oscillator signal is started (e.g., enabled) at approximately time F1. In this embodiment, a frequency of the target oscillator signal shown in FIG. 13B is significantly faster than a frequency of a reference clock signal shown in FIG. 13A. In this embodiment, before the target oscillator signal is started, increase pulses are triggered as shown in FIG. 13H. In response to a comparison of a frequency of the target oscillator signal (shown in FIG. 13B) with the frequency of the reference oscillator signal (shown in 13A) decrease pulses are triggered as shown in FIG. 13I. FIG. 13J illustrates frequency settings (which can be defined by bit values) used to trigger the frequency of the target oscillator signal shown in FIG. 13B. In this embodiment, decrease pulses continue to be triggered as shown in FIG. 13I, but the frequency setting shown in FIG. 13J is saturated at a frequency setting of "4". In some embodiments, the frequency settings shown in FIG. 13J can correspond with numeric values represented by the frequency bit values 700 shown in FIG. 7. As shown in FIG. 13H, increase pulses are not produced after approximately time F2. In this embodiment, the increase pulses (shown in FIG. 13H) and the decrease pulses (shown in FIG. 13I) are combined to produce a clock signal (shown in FIG. 13G) to a counter.

An output of a dual-D phase detector that is part of an increase processing path of a quad-D phase frequency detector is shown in FIG. 13C (e.g., output 923 of the dual-D phase detector portion 921 shown in FIG. 9), and an output of a dual-D phase detector that is part of a decrease processing path of a quad-D phase frequency detector is shown in FIG. 13D (e.g., output 922 of the dual-D phase detector portion 921 shown in FIG. 9). Also, an output of an increase processing path of a quad-D phase frequency detector is shown in FIG. 13D (e.g., output 925 of the phase detector 920 shown in FIG. 9), and an output of a decrease processing path of a quad-D phase frequency detector is shown in FIG. 13E (e.g., output 924 of the phase detector 920 shown in FIG. 9).

FIGS. 14A through 14J are graphs that illustrate a close-up view of a downward transition of a frequency of a target oscillator signal triggered by a frequency calibration device. In this embodiment, a frequency of a target oscillator signal shown in FIG. 14B is faster than a frequency of a reference clock signal shown in FIG. 14A. The target oscillator signal (shown in FIG. 14B) is configured to trigger the dual-D output associated with the decrease processing path shown in FIG. 14D to increase at approximately time G1. The target oscillator signal (shown in FIG. 14B) is configured to trigger the quad-D output associated with the decrease processing path shown in FIG. 14F to increase and configured to trigger a decrease pulse shown in FIG. 14I at approximately time G2. As shown in FIG. 14J the frequency setting decreases from "5" to "4" in response to the decrease pulse shown in FIG. 14I (which can correspond with numeric values represented by the frequency bit values 700 shown in FIG. 7). The reference oscillator signal (shown in FIG. 14A) is configured to trigger the dual-D output associated with the decrease processing path shown in FIG. 14F to reset at approximately time G3.

Implementations of the various techniques described herein may be implemented in digital electronic circuitry, or in computer hardware, firmware, software, or in combinations of them. Some implementations may be implemented using various semiconductor processing and/or packaging techniques. As discussed above, some embodiments may be implemented using various types of semiconductor processing techniques associated with semiconductor substrates including, but not limited to, for example, Silicon (Si), Gallium Arsenide (GaAs), Silicon Carbide (SiC), and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the embodiments. It should be understood that they have been presented by way of example only, not limitation, and various changes in form and details may be made. Any portion of the apparatus and/or methods described herein may be combined in any combination, except mutually exclusive combinations. The embodiments described herein can include various combinations and/or sub-combinations of the functions, components and/or features of the different embodiments described.

What is claimed is:

1. An apparatus, comprising:
a first processing path of a pulse generation circuit configured to produce a first pulse configured to trigger a change, in a first direction, of a frequency of a target oscillator signal produced by a target oscillator targeted for calibration against a frequency of a reference oscillator signal, the first pulse being synchronized with the target oscillator signal; and
a second processing path of the pulse generation circuit configured to produce a second pulse configured to trigger a change, in a second direction, of the frequency of the target oscillator signal, the second pulse being synchronized with the reference oscillator signal.

2. The apparatus of claim 1, wherein the first pulse is configured to trigger a decrease in the frequency of the target oscillator signal, and the second pulse is configured to trigger an increase in the frequency of the target oscillator signal.

3. The apparatus of claim 1, wherein the target oscillator targeted for calibration is a digitally controlled oscillator.

4. The apparatus of claim 1, wherein the first processing path includes a first plurality of flip-flops and the second processing path includes a second plurality of flip-flops, the first processing path is coupled to the second processing path via a NAND gate and via at least one inverter.

5. The apparatus of claim 1, further comprising:
a counter coupled to the first processing path and configured to receive the first pulse from the first processing path, the counter coupled to the second processing path and configured to receive the second pulse from the second processing path, the counter configured to incrementally modify a set of bits configured to define the frequency of the target oscillator signal in response to the first pulse and in response to the second pulse.

6. The apparatus of claim 1, wherein the first processing path of the pulse generation circuit is configured to produce the first pulse when a difference between the frequency of the target oscillator signal is at least one of more than two times the frequency of the reference oscillator signal or less than half the frequency of the reference oscillator signal.

7. The apparatus of claim 1, wherein the first processing path and the second processing path are interconnected such that the first pulse and the second pulse are triggered during mutually exclusive time periods.

8. The apparatus of claim 1, wherein the first processing path and the second processing path are configured to trigger the frequency of the target oscillator signal to toggle between two frequency settings disposed around the frequency of the reference oscillator signal.

9. The apparatus of claim 1, further comprising:
a counter coupled to the first processing path and the second processing path, the counter configured to produce a set of bit values controlling the frequency of the target oscillator signal,
the first processing path and the second processing path each including at least a portion of a frequency detector configured to produce a plurality of indicators of relative differences between the target oscillator signal and the reference oscillator signal during a plurality of cycles of the reference oscillator signal,
the first processing path and the second processing path each including at least a portion of a pulse generator configured to trigger the counter to incrementally modify the set of bit values.

10. The apparatus of claim 1, wherein the first pulse is produced by the first processing path is based on a relative difference between the frequency of the reference oscillator signal and the frequency of the target oscillator signal at a first time, the second pulse is produced by the second processing path is based on a relative difference between the frequency of the reference oscillator signal and the frequency of the target oscillator signal at a second time.

11. A method, comprising:
receiving a reference oscillator signal from a reference oscillator;
comparing a frequency of a target oscillator signal with a frequency of the reference oscillator signal;
producing, based on the comparing, a first pulse configured to trigger a change, in a first direction, of a frequency of the target oscillatory, the first pulse being synchronized with the target oscillator signal; and
producing, based on the comparing, a second pulse configured to trigger a change, in a second direction, of the frequency of the target oscillator, the second pulse being synchronized with the reference oscillator signal.

12. The method of claim 11, wherein the first pulse is configured to trigger a decrease in the frequency of the target oscillator signal, and the second pulse is configured to trigger an increase in the frequency of the target oscillator signal.

13. The method of claim 11, wherein the first pulse and the second pulse are triggered during mutually exclusive time periods.

14. The method of claim 11, wherein calibration of the target oscillator signal is configured to converge within 1 millisecond.

15. The method of claim 11, the comparing includes comparing the frequency of the target oscillator signal with the frequency of the reference oscillator signal during each cycle of the reference oscillator signal until calibration of the frequency of the target oscillator signal with the frequency of the reference oscillator signal has been completed.

16. The method of claim 11, wherein the change of the frequency of the target oscillator signal terminates after a calibration period of time has expired.

17. An apparatus, comprising:
a phase frequency detector configured to produce a plurality of indicators of relative differences between a frequency of a target oscillator signal and a frequency of a reference oscillator signal; and
a pulse generator configured to produce a plurality of pulses based on the plurality of indicators, the plurality of pulses including a first portion synchronized with either the target oscillator signal or the reference oscillator signal and configured to trigger an increase in the frequency of the target oscillator signal and the plurality of pulses including a second portion being synchronized with either the target oscillator signal or the reference oscillator signal and configured to trigger a decrease in the frequency of the target oscillator signal.

18. The apparatus of the claim 17, further comprising:
a counter configured to incrementally change a set of bit values defining the frequency of the target oscillator signal in response to a pulse from the plurality of pulses.

19. The apparatus of claim 17, wherein the phase frequency detector is a quad-D phase frequency detector.

20. The apparatus of claim 17, wherein:
the first portion of the plurality of pulses is synchronized with the target oscillator signal; and
the second portion of the plurality of pulses is synchronized with the target oscillator signal.

* * * * *

UNITED STATES PATENT AND TRADEMARK OFFICE
CERTIFICATE OF CORRECTION

| | |
|---|---|
| PATENT NO. | : 8,692,621 B2 |
| APPLICATION NO. | : 13/333186 |
| DATED | : April 8, 2014 |
| INVENTOR(S) | : Snowdon et al. |

It is certified that error appears in the above-identified patent and that said Letters Patent is hereby corrected as shown below:

In the Claims

Column 19, line 32, In Claim 11, delete "oscillatory," and insert -- oscillator, --, therefor.

Signed and Sealed this
Third Day of June, 2014

Michelle K. Lee
*Deputy Director of the United States Patent and Trademark Office*